US009298081B2

(12) United States Patent
Sun et al.

(10) Patent No.: US 9,298,081 B2
(45) Date of Patent: Mar. 29, 2016

(54) SCATTERING ENHANCED THIN ABSORBER FOR EUV RETICLE AND A METHOD OF MAKING

(71) Applicant: GLOBALFOUNDRIES Inc., Grand Cayman (KY)

(72) Inventors: Lei Sun, Albany, NY (US); Obert Reeves Wood, II, Loudonville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 168 days.

(21) Appl. No.: 13/790,727

(22) Filed: Mar. 8, 2013

(65) Prior Publication Data
US 2014/0254018 A1 Sep. 11, 2014

(51) Int. Cl.
*G03F 1/24* (2012.01)
*G02B 5/20* (2006.01)
*G02B 5/22* (2006.01)
*G02B 5/02* (2006.01)

(52) U.S. Cl.
CPC *G03F 1/24* (2013.01); *G02B 5/208* (2013.01); *G02B 5/22* (2013.01); *G02B 5/0242* (2013.01)

(58) Field of Classification Search
CPC ............ G03F 1/24; G03F 1/08; G03F 7/063; G03F 7/07; G03F 7/2008; G03F 7/70075; B82Y 30/00; B82Y 10/00
USPC ............ 359/599, 350, 359, 360, 361; 355/67, 355/71; 428/323, 328, 329, 325; 430/5
See application file for complete search history.

(56) References Cited

U.S. PATENT DOCUMENTS

| | | | |
|---|---|---|---|
| 6,479,195 B1 * | 11/2002 | Kirchauer et al. | 430/5 |
| 6,703,171 B2 * | 3/2004 | Hattori et al. | 430/5 |
| 2003/0198874 A1 * | 10/2003 | Lee | 430/5 |
| 2006/0007791 A1 * | 1/2006 | Bamdad | 369/13.53 |

FOREIGN PATENT DOCUMENTS

WO    WO 2006114321 A1 * 11/2006

OTHER PUBLICATIONS

Bewig et al., "Antireflection coating and process for applying", WO2006114321A1, machine translation.*
G. McIntyre, et al., "Modeling and Experiments of Non-Telecentric Thick Mask Effects for EUV Lithography," Proc. of SPIE, vol. 7271, 72711C-2, (Mar. 2009).
H. W. Jensen, et al., "A practical model for subsurface light transport," Proceeings of ACM SIGGRAPH, pp. 511-518, (2001).
J. C. Stover, "Optical Scattering: Measurement and Analysis," 2nd ed. SPIE Press., PM24, pp. 194-200, (1995).
O. Wood, et al., "Integration of EUV lithography in the fabrication of 22-nm node devices," Proc. of SPIE, vol. 7271, 727104 (2009).
P. Hanrahan, et al., "Reflection from layered surfaces due to subsurface scattering," SIGGRAPH '93 Proceedings, J. T. Kajiya, Ed., 27, pp. 165-174, (1993).
P. Naulleau, et al., "The SEMATECH Berkeley MET pushing EUV development beyond 22-nm half pitch," Proc. of SPIE, vol. 7636, 76361J, (Mar. 2010).
Wikipedia, "Diffuse Reflection," http://en.wikipedia.org/wiki/Diffuse_reflection.

* cited by examiner

*Primary Examiner* — Bumsuk Won
*Assistant Examiner* — Wen Huang
(74) *Attorney, Agent, or Firm* — Ditthavong & Steiner, P.C.

(57) ABSTRACT

A scattering enhanced thin absorber for a EUV reticle and a method of making thereof is disclosed. Embodiments include forming a multilayer on the upper surface of a substrate, forming a capping layer over the multilayer, forming one or more diffuse scattering layers over the capping layer, and etching the diffuse scattering layers to form a stack.

10 Claims, 7 Drawing Sheets

SCATTERING ENHANCED THIN ABSORBER FOR EUV RETICLE AND A METHOD OF MAKING

TECHNICAL FIELD

The present disclosure relates to absorbers in extreme ultra violet (EUV) reflective reticles. The present disclosure is particularly applicable to 20 nanometer (nm), 14 nm, and beyond semiconductor device technology nodes.

BACKGROUND

EUV lithography (EUVL) is a next-generation lithography technology for 1x nm technology nodes. A reflective mask (or EUV reticle) is used in a single-exposure process to produce imaged features on a wafer. FIG. 1 illustrates a EUV reticle 100, according to a conventional design. A reflective multilayer stack 101 on a substrate 103 reflects EUV radiation at unmasked portions by Bragg interference. Masked (non-reflective) areas 105 of EUV reticle 100 are formed by etching buffer layer 107 and absorbing layer 109. Capping layer 111 is formed over the reflective multilayer stack 101 and protects it during the etching. The thickness of absorbing layer 109 ranges from 51 to 77 nm and may be obtained from the commercial market.

FIG. 2A illustrates a conventional EUVL single-exposure process and a corresponding mask shadowing effect. EUV reticle 200 is irradiated by incident EUV 201 via non-telecentric optics (not shown for illustrative convenience) and is reflected only at unmasked portions of reflective multilayer 203 to produce imaging radiation 205. Due to the non-telecentric optics, the incident EUV 201 is at an offset angle 207 (conventionally set to six degrees) to a Z-axis normal. A mask shadowing effect 209 is induced by the interaction of the off-axis illumination with the mask topography.

Adverting to FIG. 2B, the mask shadowing effect 209 varies depending on the orientation of the mask features with respect to incident EUV 201. Specifically, the imaged features on an exposed wafer indicate a printing difference (H-V print difference) between the horizontally oriented (H) features 211 and the vertically oriented (V) features 213 of EUV reticle 200 (orientation is with respect to the plane formed by the incident EUV 201 and plane normal Z; this plane is parallel to the vertical features and perpendicular to the horizontal features). The H-V print difference becomes even greater if either the offset angle 207 or the thickness of absorber layer 215 increases.

With the absorber thickness commercially available today, it is possible to compensate the H-V print difference for 1x nm technology nodes, but it does not scale well to smaller critical dimensions, especially for half-pitch values below 25 nm. Neither simple rule-based optical proximity correction (OPC) techniques nor using a thinner absorber layer maintains the printability and defectivity at beyond 1x nm technology nodes. In particular, it is difficult to compensate for the larger H-V print difference using simple rule-based OPC, and absorber layer 215 cannot be made arbitrarily thin without engendering reduced image contrast, process window, normalized image log-slope (NILS), and increased defectivity (e.g., pinholes) caused by increased residual light reflected by reflective multilayer 203 at masked portions.

A need therefore exists for methodology enabling EUV lithography for beyond 1x nm technology nodes while enhancing printability and improving defectivity, and the resulting device.

SUMMARY

An aspect of the present disclosure is a method for fabricating a thin absorber exhibiting enhanced printability and low defectivity.

Another aspect of the present disclosure is a thin absorber exhibiting enhanced printability and low defectivity.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a multilayer on an upper surface of a substrate, forming a capping layer over the multilayer, forming one or more diffuse scattering layers over the capping layer, and etching the diffuse scattering layers to form a stack.

Aspects of the present disclosure include forming a single diffuse scattering layer with a roughened surface. Further aspects include forming an absorber layer over each diffuse scattering layer of the one or more diffuse scattering layers. Additional aspects include roughening a surface of each of the one or more diffuse scattering layers to a high frequency roughness adjacent to the overlying absorber layer. Another aspect includes forming nano-particles between each absorber layer and the underlying diffuse scattering layer or embedding nano-particles in each diffuse scattering layer or absorbing layers. Other aspects include the nano-particles including nickel (Ni), chromium (Cr), carbon (C), tantalum (Ta), or titanium (Ti).

A further aspect includes forming each diffuse scattering layer of silicon (Si) and each absorbing layer of a high EUV-absorbing material such as tantalum nitride (TaN), tantalum nitride oxide (TaNO), tantalum borate (TaBO), Ni, gold (Au), silver (Ag), C, tellurium (Te), platinum (Pt), palladium (Pd), or Cr. Additional aspects include forming each diffuse scattering layer to a thickness of 5 nm to 50 nm and forming each absorber layer to a thickness of 2 nm to 20 nm. A further aspect includes forming the total absorber stacks to a height of 60 nm or less above the capping layer. An additional aspect includes forming the capping layer of ruthenium (Ru) to a thickness of 1 nm to 5 nm. Other aspects include forming the diffuse scattering layer by depositing nanoparticles on an absorber and etching the absorber to form a porous topology.

Another aspect of the present disclosure is a reflective mask (or EUV reticle) including: a multilayer on an upper surface of a substrate, a capping layer over the multilayer, and a stack of one or more etched diffuse scattering layers over the capping layer.

Aspects of the present disclosure include the stack including a single diffuse scattering layer with a roughened surface. Another aspect includes each etched diffuse scattering layer of the stack being formed to a thickness of 5 nm to 50 nm. A further aspect includes an etched absorber layer formed over each of the one or more etched diffuse scattering layers of the stack. Another aspect includes roughened surfaces between each etched absorber layer and the underlying etched diffuse scattering layer. Other aspects include nano-particles between each etched absorber and the underlying diffuse scattering layers of first stack or embedded in each etched diffuse scattering layer of the stack. Additional aspects include the nano-particles being Ni, Cr, C, Ta, or Ti nano-particles. Another aspect includes each diffuse scattering layer being Si, and each absorbing layer such as TaN, TaNO, TaBO, Ni, Au, Ag, C, Pt, Pd, Te, or Cr.

Another aspect of the present disclosure is a method including: forming a multilayer on the upper surface of a substrate, forming a Ru capping layer over the multilayer, and forming a stack of two to twenty pairs of a diffuse scattering layer and an absorbing layer over the Ru capping layer, wherein each diffuse scattering layer includes nanoparticles embedded in or formed on a Si layer, each absorbing layer includes high absorbing materials such as TaN, TaNO, TaBO, Ni, Au, Ag, C, Pt, Pd, Te, or Cr, and the thickness of the stack is 60 nm or less.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

A perfectly diffusing surface eliminates most of the specular reflected light. The intensity of light reflected from a diffuse surface is approximated by $I = k_d \cdot I_i \cdot R_{ML}$, where $k_d$ is the diffuse reflection coefficient between 0 and 1, $I_i$ is the intrinsic intensity of a point source, and $R_{ML}$ is the reflection amplitude of a reflective multilayer utilized in EUVL reticles. For a perfect diffuse reflection, $k_d \rightarrow 0$. In order to increase the total integrated scatter (the ratio between scattered power and reflected power) at the absorptive portions of the reticle, materials or structures with high internal inhomogeneity (large number of sub-surfaces) may be used.

The present disclosure addresses and solves the current problem of H-V print difference attendant upon EUV lithography beyond 1x nm technology nodes. In accordance with embodiments of the present disclosure, a scattering enhanced thin absorber is utilized to reduce H-V print difference and improve printability for beyond 1x nm technology nodes.

Methodology in accordance with embodiments of the present disclosure includes utilization of one or more diffuse scattering layers interleaved with an absorber layer in the masked portions of a EUV reticle. Additional aspects include utilization of roughened surfaces, nano-particles, and an absorber material with an increased number of diffuse scattering sub-surfaces.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
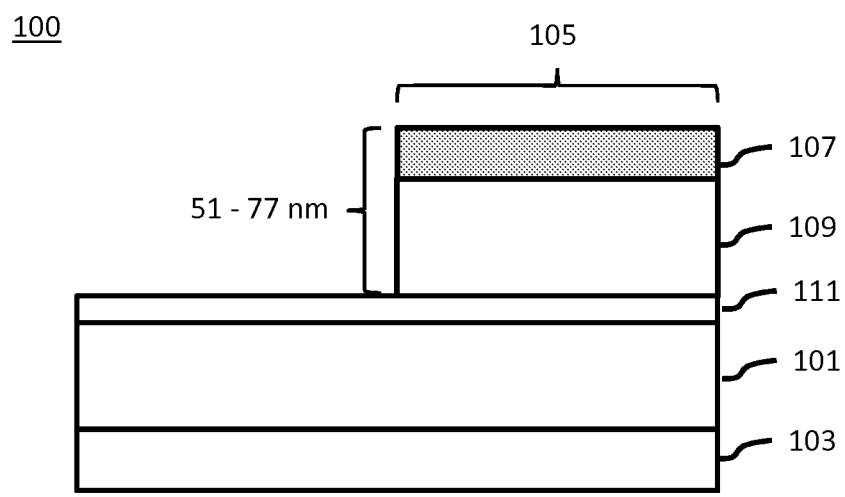
FIG. 1 schematically illustrates a background art EUV reticle employing a conventional absorber.
Figure 2A:
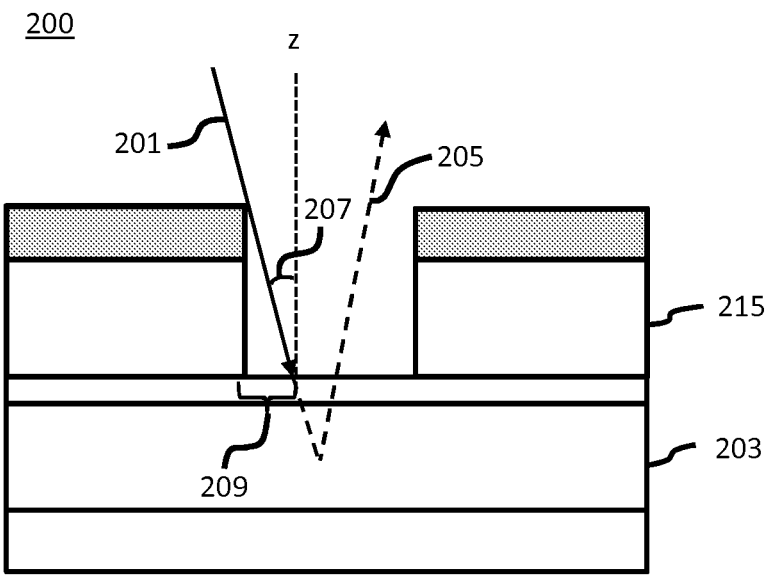
FIGS. 2A and 2B schematically illustrate a shadow mask effect observed with a background art EUVL reticle employing a conventional absorber.
Figure 2B:
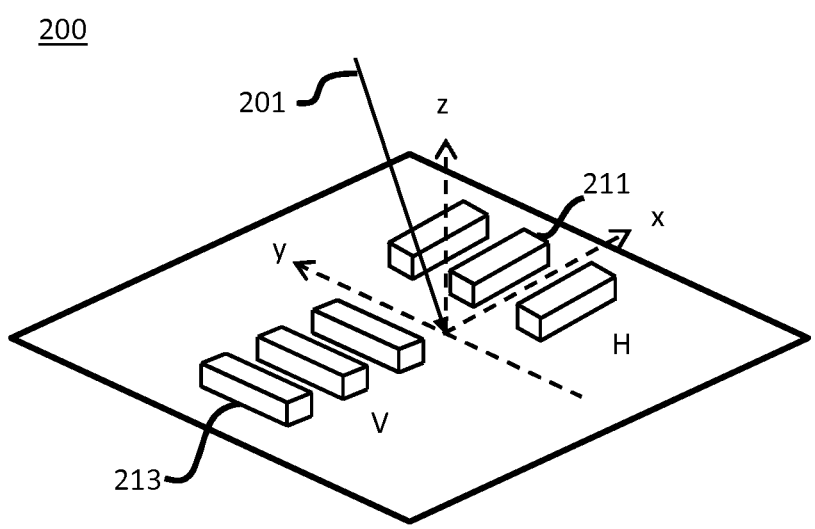
Figure 3A:
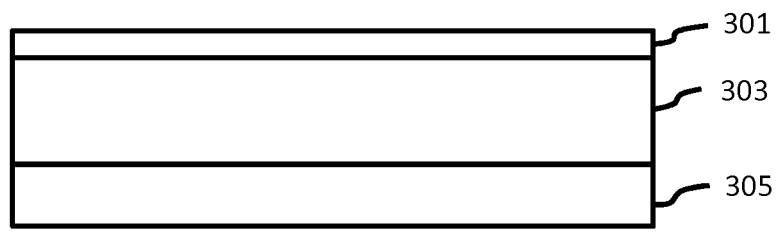
FIGS. 3A through 3C schematically illustrate a process flow for forming a EUV reticle employing a scattering enhanced thin absorber, in accordance with an exemplary embodiment of the present disclosure.
Figure 3B:
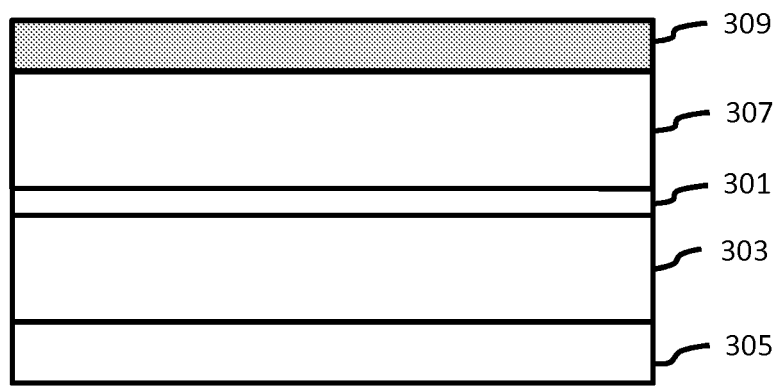
Figure 3C:
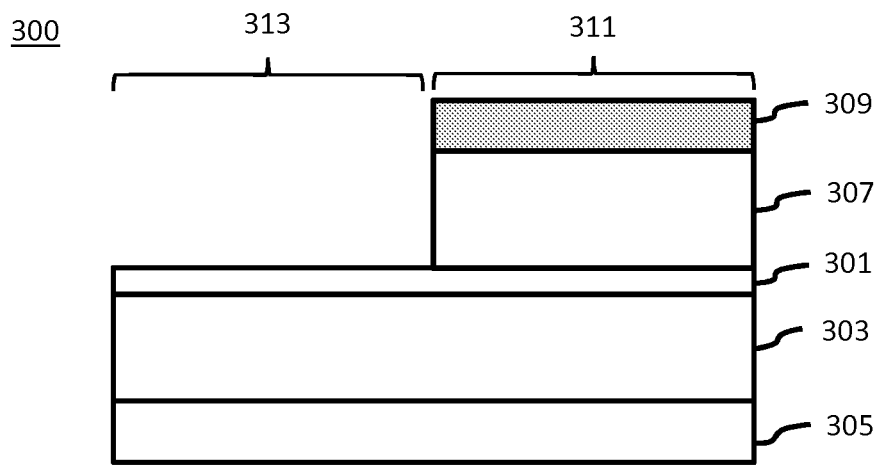

FIGS. 3A through 3C schematically illustrate various process steps for forming EUV reticle 300 employing a scattering enhanced thin absorber, in accordance with an exemplary embodiment of the present disclosure.

FIG. 3A illustrates capping layer 301 and reflective multilayer 303 deposited over substrate 305. Capping layer 301 may be formed of Ru and may have a thickness from 1 nm to 5 nm.

Adverting to FIG. 3B, diffuse scattering layer 307 and absorber layer 309 are formed over capping layer 301. Diffuse scattering layer 307 may include, for example, a material with a high degree of surface roughness. The thickness of diffuse scattering layer 307 may be from 5 nm to 50 nm and the thickness of the absorber layer may be from 2 nm to 20 nm. Alternatively, absorber layer 309 may be omitted, if diffuse scattering layer 307 is a perfect scattering material.

Finally, as shown in FIG. 3C, diffuse scattering layer 307 and absorber layer 309 are etched to leave behind a masked non-reflective portion 311 and an unmasked reflective portion 313 of EUV reticle 300.

Figure 4A:
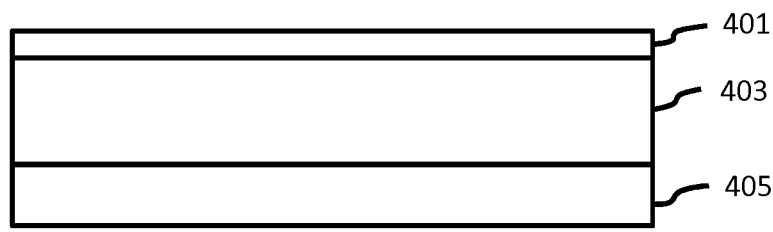
FIGS. 4A through 4C schematically illustrate a process flow for forming a EUV reticle employing a scattering enhanced thin absorber, in accordance with another exemplary embodiment of the present disclosure.
Figure 4B:
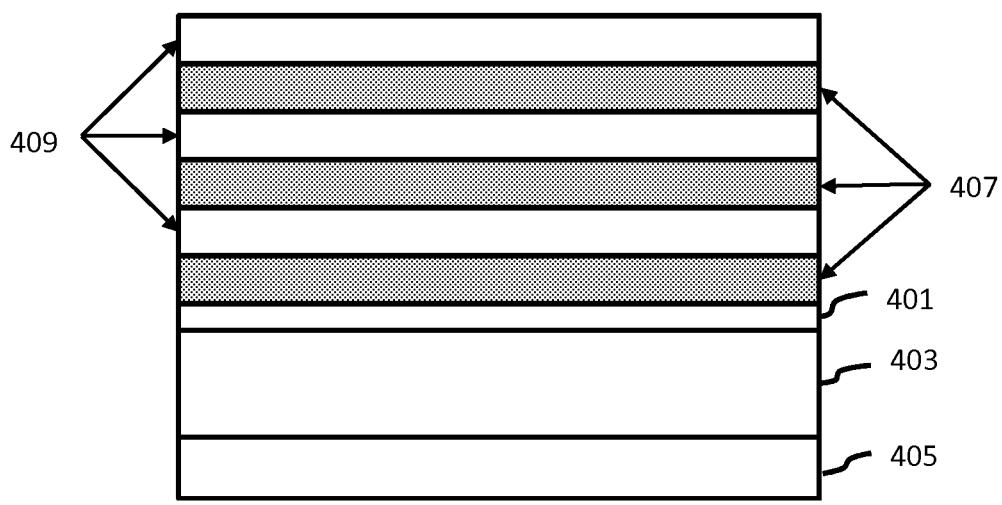
Figure 4C:
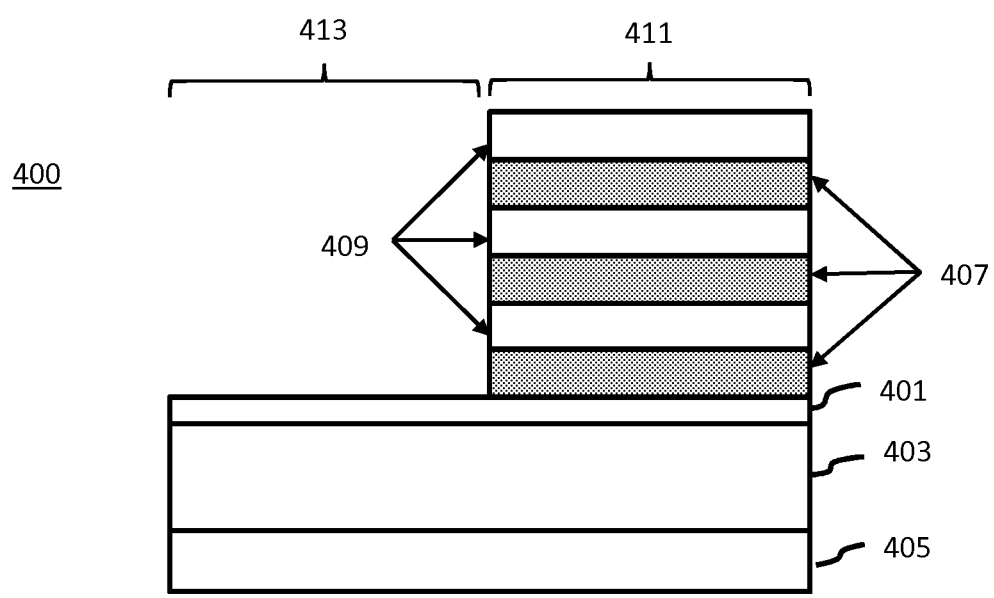

FIGS. 4A through 4C schematically illustrate a process flow for forming a EUV reticle employing a scattering enhanced thin absorber, in accordance with another exemplary embodiment of the present disclosure.

FIG. 4A illustrates capping layer 401 and reflective multilayer 403 formed over substrate 405. Capping layer 401 may be formed of Ru and may have a thickness from 1 nm to 5 nm.

Adverting to FIG. 4B, one or more diffuse scattering layers 407 and a corresponding number of absorber layers 409 are formed interleaved over capping layer 401. The number of repeats for the diffuse scattering layer 407 and absorber layer 409 pairs may, for example, be between 2 and 20. Diffuse scattering layer 407 may have a thickness of 5 nm to 50 nm and may be formed of, for example, Si. Alternatively, diffuse scattering layer 407 may be formed of a strong absorber material filled with nano-particles. Strong absorber materials may include, for example, Si, TaN, TaNO, TaBO, Cr, Ni, etc. The nano-particles may be formed of, for example, Ni, Cr, C, Ta, or Ti. Absorber layer 409 may have a thickness of 2 nm to 20 nm and may be formed of, for example, TaN, TaNO, TaBN, TaBO, Ni, Au, Ag, Te, C, Pt, Pd or Cr.

Finally, as shown in FIG. 4C, diffuse scattering layers 407 and absorber layers 409 are etched to leave behind a masked non-reflective portion 411 and an unmasked reflective portion 413 of EUV reticle 400.

Figure 5:
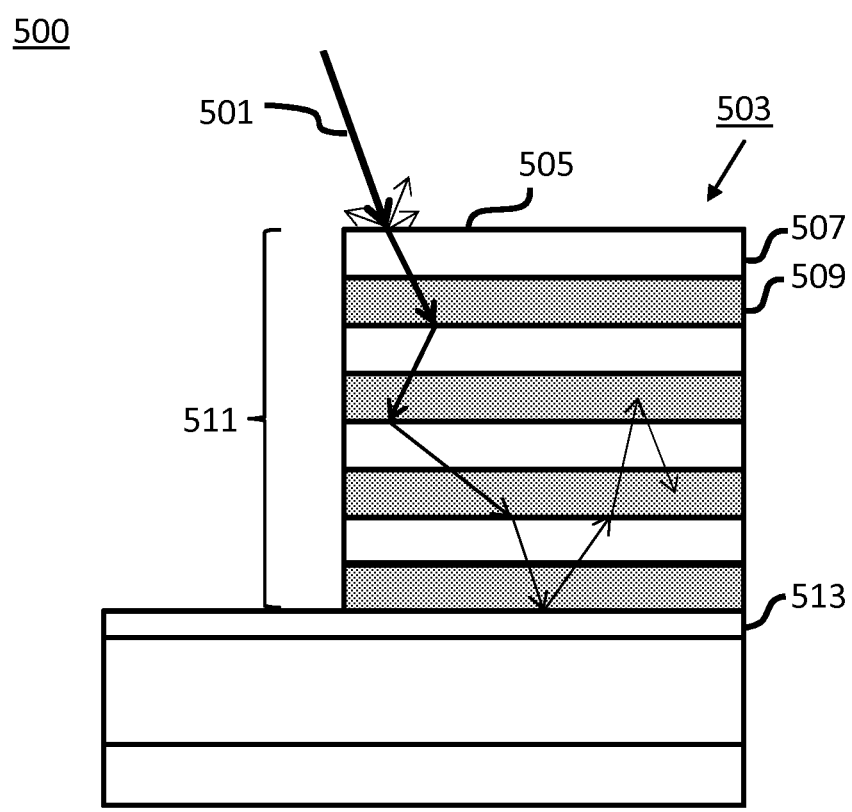
FIG. 5 schematically illustrates a EUV reticle employing a scattering enhanced thin absorber, formed in accordance with an exemplary embodiment of the present disclosure, as EUV radiation is incident upon it.

FIG. 5 illustrates incident EUV radiation 501 on EUV reticle 500 as it is diffuse scattered, according to an exemplary embodiment. As shown, some portion of the radiation is scattered at surface 505 of absorber 503. Most of the radiation goes through first absorber layer 507 and first diffuse scattering layer 509. The scattering reflection at first diffuse scattering layer 509 is absorbed by first absorber layer 507. The residual radiation is bounced back and forth in the remaining absorber layers and diffuse scattering layers until completely absorbed. Even though the height 511 of absorber 503 above capping layer 513 may be equal to or less than 60 nm, the overall optical path is made much greater than 60 nm due to the multiple reflections at the absorber and diffuse scattering layers.

Figure 6A:
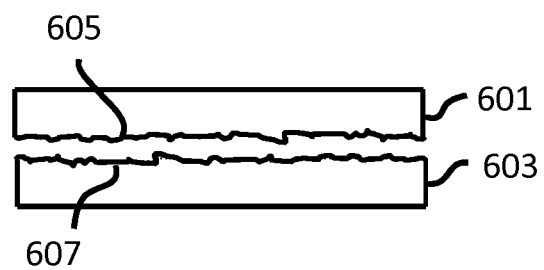
FIGS. 6A through 6C schematically illustrate modifications to a scattering enhanced thin absorber, in accordance with various additional exemplary embodiments of the present disclosure.
Figure 6B:
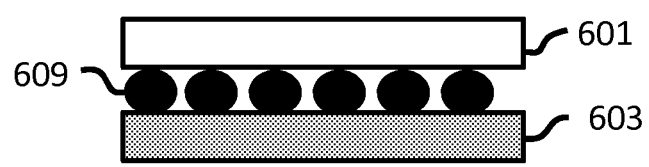
Figure 6C:

FIGS. 6A through 6C schematically illustrate modifications to a scattering enhanced thin absorber, in accordance with various additional exemplary embodiments of the present disclosure.

Adverting to FIG. 6A, absorber layer 601 and diffuse scattering layer 603 are shown formed with their respective adjacent surfaces 605 and 607 having a high frequency surface roughness to induce further diffuse scattering of incident EUV radiation.

Adverting to FIG. 6B, absorber layer 601 and diffuse scattering layer 603 are shown with nano-particles 609 filled between their respective adjacent surfaces. Nano-particles 609 may be formed of Ni, Cr, C, Ta, Ti, hafnium (Hf), or zirconium (Zr), all of which have large refractive index difference than the surrounding material.

Adverting to FIG. 6C, diffuse scattering layer 603 may be filled with nano-particles 611 to create additional diffuse scattering sub-surfaces. Nano-particles 611 may be formed of Ni, Cr, C, Ta, Ti, Hf, or Zr, which have large refractive index difference than the surrounding material.

Figure 7:
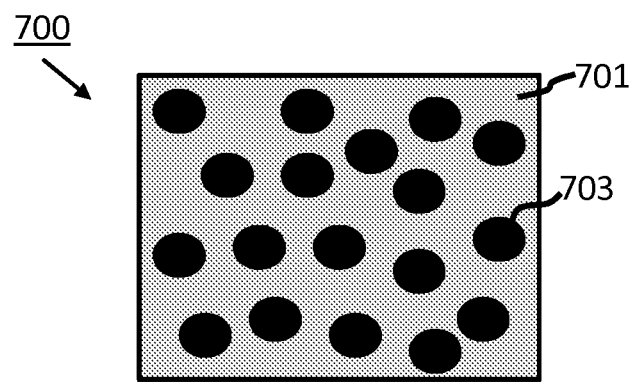
FIG. 7 schematically illustrates a scattering enhanced thin absorber material, in accordance with an exemplary embodiment of the present disclosure.

In addition to increasing diffuse scattering at surfaces of the diffuse scattering and absorber layers, diffuse scattering may also be enhanced by increasing the number of sub-surfaces within a single absorber layer. FIG. 7 schematically illustrates an enhanced thin absorber material, in accordance with an exemplary embodiment of the present disclosure As shown in FIG. 7, an absorber material 701 may be filled with nano-particles 703, which produces a diffuse scattering material 700 with a large number of sub-surfaces. Diffuse scattering material 700 may be formed by adding nano-particles to absorber material 701 in powdered form or solution and then depositing the mixture. Nano-particles 611 may be formed of Ni, Cr, C, Ta, Ti, Hf, or Zr, which have large refractive index difference than the surrounding material. Absorber material 701 may include Si, TaN, TaNO, TaBN, TaBO, Cr, Au, Ag, C, Pt, Pd, Te or Ni.

Figure 8A:
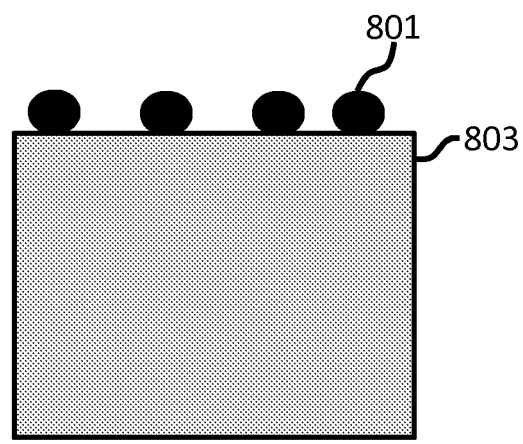
FIGS. 8A and 8B schematically illustrate a process flow forming another scattering enhanced thin absorber material, in accordance with an exemplary embodiment of the present disclosure.
Figure 8B:
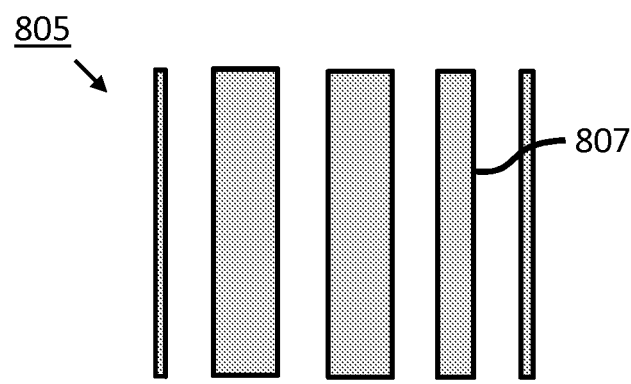

FIGS. 8A and 8B schematically illustrate various process steps for forming another enhanced diffuse scattering material, in accordance with an exemplary embodiment of the present disclosure. As shown in FIG. 8A, nano-particles 801 are sparsely deposited on an absorber material 803, which is then etched to create a highly porous absorber material 805. Diffuse scattering is enhanced at the large number of sub-surfaces 807.

The embodiments of the present disclosure can achieve several technical effects, including improved printability and low defectivity at sub 1x nm technology nodes produced by EUVL. The present disclosure enjoys industrial applicability in any of various EUVL systems used to produce devices for various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a multilayer on an upper surface of a substrate;
   forming a capping layer over the multilayer;
   forming diffuse scattering layers comprising silicon (Si) over the capping layer, each diffuse scattering layer formed to a thickness of 5 nanometers (nm) to 50 nm;
   forming an absorber layer to a thickness of 2 nm to 20 nm over each diffuse scattering layer, each absorbing layer comprising tantalum nitride (TaN), tantalum nitride oxide (TaNO), tantalum borate (TaBO), Ni, gold (Au), silver (Ag), C, tellurium (Te), platinum (Pt), palladium (Pd), or Cr;
   forming nano-particles between each absorber layer and the underlying diffuse scattering layers or embedding nano-particles in each diffuse scattering layer; and
   etching the diffuse scattering layers to form a stack.

2. The method according to claim 1, further comprising:
   roughening a surface of each diffuse scattering layer adjacent to the overlying absorber layer to a surface roughness to further induce diffuse scattering.

3. The method according to claim 1, wherein:
   the nano-particles comprise nickel (Ni), chromium (Cr), carbon (C), tantalum (Ta), titanium (Ti), hafnium (Hf), or zirconium (Zr), which have a refractive index different than the surrounding material.

4. The method according to claim 1, comprising forming the stack to a height of 60 nm or less above the capping layer.

5. The method according to claim 1, comprising forming the capping layer of ruthenium (Ru) to a thickness of 1 nm to 5 nm.

6. The method according to claim 1, comprising:
forming each diffuse scattering layer by depositing nano-particles on an absorber; and
etching the absorber to form a porous topology.

7. A device comprising:
a multilayer on the upper surface of a substrate;
a capping layer over the multilayer;
a stack of etched diffuse scattering layers over the capping layer, each etched diffuse scattering layer comprising silicon (Si) and each diffuse scattering layer formed to a thickness of 5 nanometers (nm) to 50 nm;
an etched absorber layer formed over each of the etched diffuse scattering layers of the stack, each absorbing layer formed to a thickness of 2 nm to 20 nm and each absorbing layer comprising tantalum nitride (TaN), tantalum nitride oxide (TaNO), tantalum borate (TaBO), Ni, gold (Au), silver (Ag), C, tellurium (Te), platinum (Pt), palladium (Pd), or Cr; and
nano-particles between each etched absorber and the underlying diffuse scattering layers of the stack or embedded in each etched diffuse scattering layer of the stack.

8. The device according to claim 7, further comprising:
roughened surfaces between each etched absorber layer and the underlying etched diffuse scattering layer to induce diffuse scattering.

9. The device according to claim 7, wherein:
the nano-particles comprise nickel (Ni), chromium (Cr), carbon (C), tantalum (Ta), titanium (Ti), hafnium (Hf), or zirconium (Zr) nano-particles.

10. A method comprising:
forming a multilayer on the upper surface of a substrate;
forming a ruthenium (Ru) capping layer over the multilayer; and
forming a stack of two to twenty pairs of a diffuse scattering layer and an absorbing layer over the Ru capping layer, wherein:
each diffuse scattering layer comprises silicon (Si) and is formed to a thickness of 5 nanometers (nm) to 50 nm;
each diffuse scattering layer comprises nanoparticles embedded in or formed on the diffuse scattering layer;
each absorbing layer comprises tantalum nitride (TaN), tantalum nitride oxide (TaNO), tantalum borate (TaBO), nickel (Ni), gold (Au), silver (Ag), carbon (C), tellurium (Te), platinum (Pt), palladium (Pd), or chromium (Cr);
each absorbing layer is formed to a thickness of 2 nm to 20 nm;
a total thickness of the stack is 60 nm or less; and
said nano-particles comprise nickel (Ni), chromium (Cr), carbon (C), tantalum (Ta), titanium (Ti), hafnium (Hf), or zirconium (Zr) nano-particles.

* * * * *